United States Patent [19]

Scanlan et al.

[11] Patent Number: 5,751,552
[45] Date of Patent: May 12, 1998

[54] SEMICONDUCTOR DEVICE BALANCING THERMAL EXPANSION COEFFICIENT MISMATCH

[75] Inventors: Christopher M. Scanlan; Carl J. Raleigh, both of Phoenix, Ariz.

[73] Assignee: Motorola, Inc., Schaumburg, Ill.

[21] Appl. No.: 851,811

[22] Filed: May 6, 1997

Related U.S. Application Data

[63] Continuation of Ser. No. 688,084, Jul. 29, 1996, abandoned, and Ser. No. 452,753, May 30, 1995, abandoned.

[51] Int. Cl.$^6$ ........................................... H05K 7/20
[52] U.S. Cl. ................... 361/707; 174/52.2; 257/706; 257/724; 361/719
[58] Field of Search ........................ 257/678, 687, 257/787, 796, 706, 712, 713, 715, 723, 724; 174/16.3, 52.2, 52.4; 165/80.3, 185; 428/654, 675, 901; 361/689, 690, 704, 712, 707–709, 713, 722, 717–719, 752, 757

[56] References Cited

U.S. PATENT DOCUMENTS

| | | | |
|---|---|---|---|
| 4,623,577 | 11/1986 | Hsiue | 428/209 |
| 4,806,704 | 2/1989 | Belke, Jr. | 174/52.4 |
| 4,943,468 | 7/1990 | Gordon et al. | |
| 5,015,803 | 5/1991 | Mahulikar | 174/52.4 |
| 5,251,803 | 10/1993 | Kashiba | 228/124.5 |
| 5,306,571 | 4/1994 | Dolowy, Jr. | 428/608 |
| 5,367,196 | 11/1994 | Mahulikor et al. | 257/787 |
| 5,369,058 | 11/1994 | Burns | 437/209 |
| 5,371,043 | 12/1994 | Anderson et al. | 437/209 |
| 5,386,143 | 1/1995 | Fitch | 257/715 |
| 5,435,877 | 7/1995 | Ishii | 156/264 |
| 5,481,136 | 1/1996 | Kohmoto | 257/712 |

FOREIGN PATENT DOCUMENTS

| | | |
|---|---|---|
| 0018890 | 11/1980 | European Pat. Off. . |
| 0279601 | 8/1988 | European Pat. Off. . |
| 0468475 | 1/1992 | European Pat. Off. . |
| 0676800 | 10/1995 | European Pat. Off. . |
| 0693776 | 1/1996 | European Pat. Off. . |

OTHER PUBLICATIONS

Patent Abstracts of Japan, vol. 017, No. 556 (E–1444), 6 Oct. 1993 & JP–A–05 160169 (Hitachi Ltd), 25 Jun. 1993, 1 Page.

Patent Abstracts of Japan, vol. 011, No. 088 (E–490), 18 Mar. 1987 & JP–A–61 240665 (Sanyo Electric Co. Ltd; Others: 01), 25 Oct. 1986, 1 Page.

Primary Examiner—Gerald P. Tolin
Attorney, Agent, or Firm—George C. Chen

[57] ABSTRACT

A hybrid multi-chip module includes semiconductor chips (27, 31) bonded to a base plate (24). The base plate includes a substrate (11) having two surfaces (12, 13) and a conductive material (16) molded on the two surfaces (12, 13). A coefficient of thermal expansion (CTE) mismatch between the substrate (11) and the conductive material (16) at the first surface (12) is balanced by a similar, but opposite, CTE mismatch between the substrate (11) and the conductive material (16) at the second surface (13). The CTE mismatch balance across the base plate (24) produces a base plate (24) having a substantially planar form at high temperatures.

19 Claims, 1 Drawing Sheet

5,751,552

1

SEMICONDUCTOR DEVICE BALANCING THERMAL EXPANSION COEFFICIENT MISMATCH

This application is a continuation of prior application Ser. Nos. 08/688,084, filed Jul. 29, 1996, and 08/452,753, May 30, 1995, both now abandoned.

BACKGROUND OF THE INVENTION

This invention relates, in general, to a hybrid multi-chip module, and more particularly, to a base plate used in a hybrid multi-chip module.

As known in the art, hybrid multi-chip modules commonly use an isolation substrate mounted on a copper base plate which serves as a heat sink. A thin metallic sheet is bonded to the isolation substrate, and semiconductor chips are bonded to the thin metallic sheet. The semiconductor chips can be electrically coupled to the thin metallic sheet when the thin metallic sheet is patterned, or a separate leadframe can be attached to the semiconductor chips. The semiconductor chips are then encapsulated with a resin for protection.

The above described hybrid multi-chip module has several disadvantages. Having significantly different thermal expansion coefficients, the copper base plate and the isolation substrate expand at different rates under high temperature. This difference in expansion rates warps the isolation substrate and decreases the heat transfer efficiency from the semiconductor chip to the copper base plate heat sink. While the use of a thicker isolation substrate reduces warpage, it also decreases the heat transfer efficiency from the semiconductor chips to the heat sink since the heat must be transferred through the thicker isolation substrate.

A metal matrix composite of aluminum silicon carbide can be substituted for the copper base plate to improve the thermal expansion coefficient mismatch between the base plate and the isolation substrate, but under extreme temperatures, warpage still occurs. Furthermore, a different thermal expansion coefficient mismatch still exists between the thin metallic sheet and the isolation substrate. Warpage significantly degrades the reliability of the hybrid multi-chip module.

Manufacturing of the above described hybrid multi-chip module uses two separate pairs of molding plates, each of which cost approximately $25,000. The first pair is used for casting a porous ceramic preform to which the insulation substrate is bonded; and the second pair is used for infiltrating the porous ceramic preform and for casting the thin metallic sheet over the porous ceramic preform and the insulation substrate to complete the base plate. This dual casting process is expensive and time consuming.

Accordingly, a need exists for an improved hybrid multi-chip module and an improved method of fabricating the base plate for the hybrid multi-chip module. The module should reduce warpage and improve reliability, thermal conductivity, and heat transfer efficiency. The method should improve the cycle time and reduce the cost of the process.

2

DETAILED DESCRIPTION OF THE DRAWINGS

Figure 1:
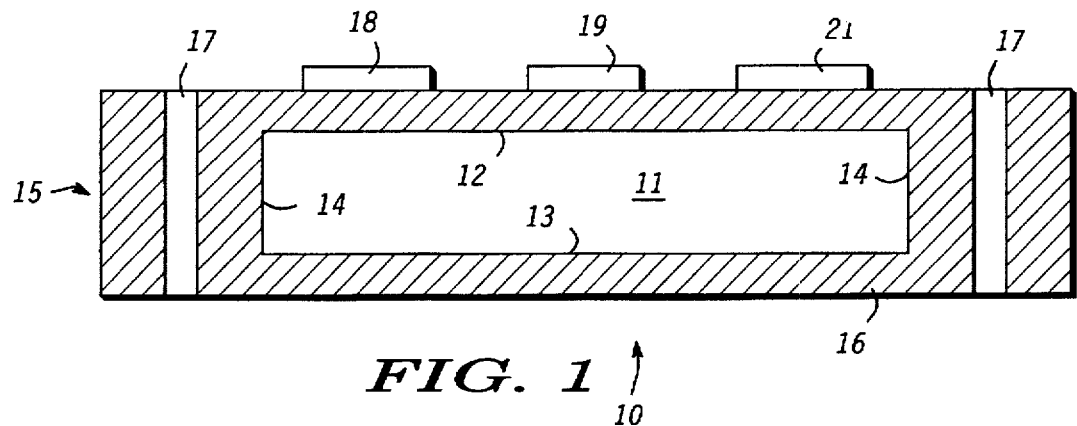
FIG. 1 illustrates a cross-section of an unencapsulated hybrid multi-chip module in accordance with the present invention.

Turning first to FIG. 1, ceramic substrate 11 has surfaces 12 and 13 and side surfaces 14. Ceramic substrate 11 is approximately 500 microns to 2000 microns thick and comprises materials such as aluminum nitride, aluminum oxide, silicon carbide, beryllium oxide, boron nitride, and other insulators. When ceramic substrate 11 is thicker, base plate 15 is more rigid which reduces warpage of base plate 15 and provides more support for semiconductor chips 18, 19, and 21. When ceramic substrate 11 is thinner, base plate 15 is more efficient at dissipating heat from semiconductor chips 18, 19, and 21.

As described in U.S. Pat. No. 5,371,043, which issued to Anderson, et. al., and is hereby incorporated herein by reference, conductive material 16 is molded or casted around ceramic substrate or substrate 11 on surfaces 12 and 13 and on side surfaces 14. Conductive material 16 comprises materials such as aluminum, copper, and other conductors. Conductive material 16 is approximately 20 to 500 microns thick over surfaces 12 and 13 and is approximately 2,500 to 20,000 microns thick over side surfaces 14. Substrate 11 and conductive material 16 comprise base plate 15. Conductive material 16 can contain holes 17 at a periphery of base plate 15 to facilitate fastening base plate 15 to an article such as a heatsink.

It is important to note that conductive material 16 is casted or molded around substrate 11. Conductive material 16 is not first preformed and then bonded to substrate 11 using conventional brazing techniques as in the prior art. Brazing techniques produce an interfacial layer between conductive material 16 and substrate 11 which reduces heat transfer efficiency of prior art hybrid multi-chip modules. A casting process eliminates the detrimental formation of an interfacial layer, and therefore does not degrade the heat transfer efficiency of hybrid multi-chip module 10.

Semiconductor chips 18, 19, and 21 comprise hybrid devices or circuits fabricated on silicon, silicon germanium, gallium arsenide, indium phosphide, or other semiconductor substrates. The hybrid devices and circuits are fabricated using techniques known in the art. After fabrication, but preferably before packaging, semiconductor chips 18, 19, and 21 are bonded to conductive material 16 nearest surface 12 of substrate 11. The bonding technique includes flip chip bonding in which case conductive material 16 on surface 12 is patterned (not shown). When flip chip bonding is not used, leadframes (not shown) can be used for electrical coupling to semiconductor chips 18, 19, and 21. Finally, after electrical coupling, semiconductor chips 18, 19, and 21, are encapsulated with a packaging resin (not shown) which is molded onto base plate 15 covering semiconductor chips 18, 19, and 21.

Fabricated using the above process, base plate 15 of hybrid multi-chip module 10 has a high thermal conductivity of approximately 200 to 260 watts/meter-degrees Celsius (°C.). However, base plate 15 has a thermal expansion coefficient mismatch between aluminum nitride substrate 11 which has a thermal expansion coefficient or coefficient of thermal expansion (CTE) of approximately 4.5 parts per meter (ppm)/°C. and aluminum conductive material 16 which has a CTE of approximately 22.1 ppm/°C. Due to the CTE mismatch, if conductive material 16 were on surface 12 of substrate 11 and not on surface 13, base plate 15 would have a concave shape in a high temperature environment. Surfaces 12 and 13 would be curved such that side surfaces 14 of substrate 11 move away from semiconductor chips 18, 19, and 21 to produce the concave bow. Residual stresses of the CTE mismatch produce unequal bending moments in base plate 15 and produce the concave bow in base plate 15. If base plate 15 were fastened to a separate heatsink (not shown) using connectors (not shown) positioned through holes 17 such that surface or back surface 13 were closest to the heatsink, the thermal transfer efficiency from semiconductor chips 18, 19, and 21 to the heatsink would be extremely poor since a central portion of base plate 15 bulges away from the heatsink due to its concave shape.

However, if conductive material 16 is also casted on back surface 13 of substrate 11, the CTE mismatch can be balanced across substrate 11, and base plate 24 will have a substantially planar form. While conductive material 16 stresses substrate 11 on surface 12, conductive material 16 can supply a similar, but opposite, stress on back surface 13 of substrate 11. With equal and opposite stresses across substrate 11, the bending moments are neutralized, and base plate 15 remains planar even at high temperatures. Balancing the CTE mismatch across substrate 11 can be accomplished by casting a similar thickness of conductive material 16 on surfaces 12 and 13. The casting or molding of conductive material 16 overlying side surfaces 14 also aids in balancing the CTE mismatch across substrate 11 which produces advantages over the prior art. First, as mentioned previously, the balance produces a substantially planar form for base plate 15. Second, the reliability of base plate 15 is significantly improved over the reliability of base plates used in the prior art. The reliability is most noticeably improved when conductive material 16 is casted on side surfaces 14.

The balancing of the CTE mismatch can also be adjusted to where a small residual stress remains such that base plate 15 has a small convex bow of approximately 0 to 300 microns at room temperature or at high temperatures. With the convex bow, surfaces 12 and 13 of substrate 11 are curved such that side surfaces 14 move toward semiconductor chips 18, 19, and 21. With base plate 15 fastened to a heatsink as mentioned previously, the periphery of base plate 15 is fastened to the heatsink such that the periphery of conductive material 16 on back surface 13 cannot flex away from the heatsink and remains in contact with the heatsink even at high temperatures. With a convex bow, the central portion of base plate 15 does not bulge away from the heatsink as in the prior art. Therefore, the convex bow of the present invention is preferred over the concave bow of the prior art since the concave bow does not maintain adequate contact with the backside heatsink while the convex bow does maintain adequate contact with the backside heatsink.

If materials other than aluminum and aluminum nitride are used for conductive material 16 and substrate 11, respectively, the thicknesses of conductive material 16 and substrate 11 may vary from the ranges listed above. While other materials can be substituted, they should have similar or superior thermal and electrical conductivity for conductive material 16 and similar or superior isolation properties for substrate 11. The other materials should also have a CTE mismatch which can be balanced across base plate 15.

Figure 2:
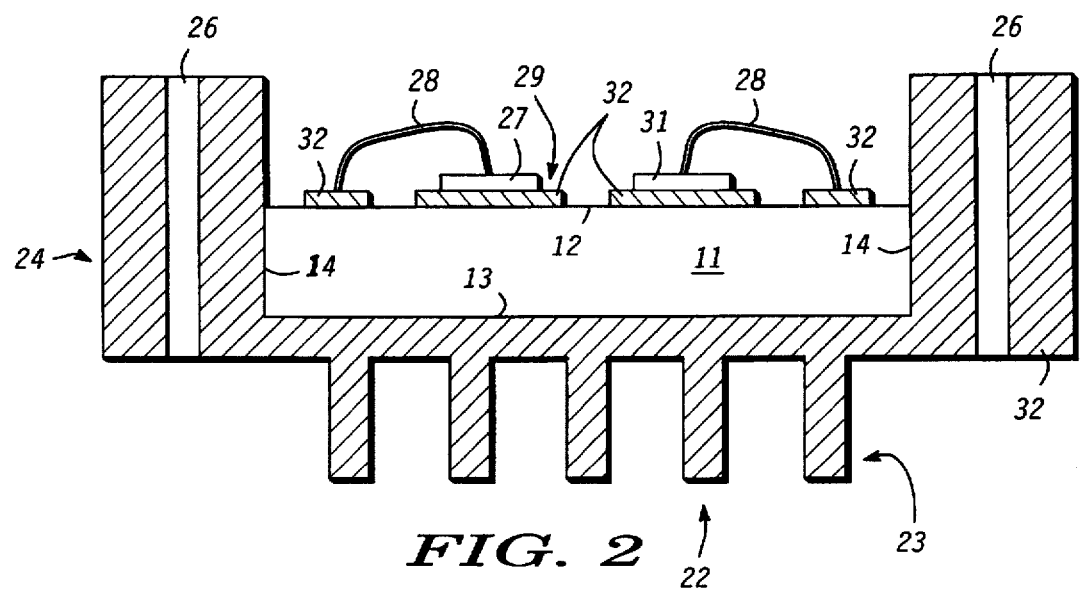
FIG. 2 illustrates a cross-section of an alternative embodiment of an unencapsulated hybrid multi-chip module.

Continuing with an alternative embodiment in accordance with the present invention, FIG. 2 depicts hybrid multi-chip module 22 with base plate 24 comprising conductive material 32 and substrate 11 with side surfaces 14 and surfaces 12 and 13. Conductive material 32 is casted over substrate 11 as described in FIG. 1, except that conductive material 32 is casted as pattern 29 on surface 12. Holes 26 of FIG. 2 serve a similar purpose as holes 17 of FIG. 1. Also molded out of conductive material 32 is heatsink 23 located under surface 13 of substrate 11.

Similar to semiconductor chips 18, 19, and 21, semiconductor chips 27 and 31 are bonded to pattern 29 of base plate 24 and wire bonding wires 28 are used for electrical coupling to pattern 29. Semiconductor chips 27 and 31 can be vertical devices with backside contacts such that the electrical coupling to pattern 29 is accomplished through wire bonding wires 28 and also through direct contact of semiconductor chips 27 and 31 to pattern or patterned conductive material 29. It is to be understood that hybrid multi-chip modules 10 and 22 can also be used for a single semiconductor chip or for a non-hybrid multi-chip module.

Substrate 11 and conductive material 32 have similar physical characteristics as described in FIG. 1. Substrate 11 is an insulator providing electrical isolation between patterned conductive material 29 and heatsink 23, especially when patterned conductive material 29 is used to electrically couple semiconductor chips 27 and 31. While providing electrical isolation, substrate 11 also has high thermal conductivity to provide efficient heat transferal from semiconductor chips 27 and 31 to heatsink 23. Conductive material 32 has electrically and thermally conductive properties to provide electrical coupling to semiconductor chips 27 and 31 and to provide thermal dissipation from hybrid multi-chip module 22.

The different CTE between substrate 11 and conductive material 32 produces stresses at the interface between substrate 11 and conductive material 32. The stresses produce bending moments across base plate 24 at surfaces 12 and 13. However, the CTE mismatch at surface 12 balances the CTE mismatch at surface 13 to produce substantially planar base plate 24. If pattern 29 covers a significant portion of surface 12, the CTE mismatch can be balanced across substrate 11 by casting a similar thickness of conductive material 32 over surfaces 12 and 13. If pattern 29 covers a small portion of surface 12, the CTE mismatch can be balanced across substrate 11 by casting a thicker layer of conductive material 32 on surface 12 compared to surface 13. As mentioned in FIG. 1, conductive material 32 overlying side surfaces 14 also aids in balancing the residual stress across base plate 24.

To balance the CTE mismatch across base plate 24, pattern 29 on surface 12 can alternatively comprise a different conductor compared to conductive material 32 having a different CTE and a different thickness to produce substantially planar base plate 24. Furthermore, at least one additional layer of conducting material can be molded over conductive material 32.

It is important to note that controlling the bow of base plate 15 in FIG. 1 is more important than controlling the bow of base plate 24 in FIG. 2. Since heatsink 23 is casted directly to substrate 11 in FIG. 2, heatsink 23 and substrate 11 remain in direct contact with each other and thermal performance is not degraded even if base plate 24 warps. However, base plate 15 in FIG. 1 must contact a separate heatsink for efficient heat dissipation and, therefore, must remain substantially planar.

The mounting of hybrid multi-chip module 22 to an article (not shown) can be accomplished by inserting connectors through holes 26 to fasten hybrid multi-chip module 22 to the article such that semiconductor chips 27 and 31 are located between the article and heatsink 23. In this manner, heatsink 23 is exposed to more efficiently dissipate heat from semiconductor chips 27 and 31. In addition to or in place of using holes 26 to fasten hybrid multi-chip module 22 to an article, a surface of conductive material 32 can be bonded to the article.

Therefore, in accordance with the present invention, it is apparent there has been provided an improved hybrid multi-chip module which overcomes the disadvantages of the prior art. The present invention eliminates concave bowing of a base plate and improves the thermal conductivity, heat transfer efficiency, and reliability of a hybrid multi-chip module. The method of fabricating the hybrid multi-chip module and its base plate is lower in cost and shorter in cycle time due to the use of a reduced set of molding plates and a reduced number of casting steps.

We claim:

1. A semiconductor device comprising:

a semiconductor chip;

a substrate having a thermal expansion coefficient, a first surface, a second surface opposite the first surface, and a side surface coupling the first and second surfaces, the semiconductor chip overlying the first surface; and a material coupled to the substrate, the material having a thermal expansion coefficient different from the thermal expansion coefficient of the substrate, a first portion of the material having a thickness over the first surface of the substrate and located under the semiconductor chip, a second portion of the material having a thickness over the second surface of the substrate, a third portion of the material having a thickness over the side surface of the substrate wherein the thickness of the third portion of the material is greater than the thickness of the first portion of the material and is greater than the thickness of the second portion of the material, wherein the thickness of the first portion of the material is measured in a direction perpendicular to the first surface of the substrate, wherein the thickness of the second portion of the material is measured in a direction perpendicular to the second surface of the substrate, and wherein the thickness of the third portion of the material is measured in a direction perpendicular to the side surface of the substrate.

2. The semiconductor device of claim 1 wherein the substrate is selected from the group consisting of aluminum nitride, aluminum oxide, silicon carbide, beryllium oxide, and boron nitride and wherein the material is selected from the group consisting of aluminum and copper.

3. The semiconductor device of claim 1 wherein the third portion of the material physically contacts the second portion of the material.

4. The semiconductor device of claim 3 wherein the material encapsulates the substrate.

5. The semiconductor device of claim 1 wherein the substrate has a convex bow of less than 300 microns.

6. The semiconductor device of claim 1 wherein the substrate has a substantially planar form, wherein the substrate is comprised of a ceramic, and wherein the material is comprised of a metal.

7. The semiconductor device of claim 1 further comprising a heatsink formed by the second portion of the material, the heatsink adjacent to the second surface of the substrate.

8. The semiconductor device of claim 1 wherein the first portion of the material is patterned and wherein the semiconductor chip is coupled to the first portion of the material.

9. The semiconductor device of claim 1 wherein the thickness of the first portion of the material is different from the thickness of the second portion of the material.

10. A semiconductor device comprising:

a semiconductor chip;

a substrate having a thermal expansion coefficient, a first surface, a second surface opposite the first surface, and a side surface coupling the first and second surfaces, the semiconductor chip overlying the first surface; and a material coupled to the substrate, the material having a thermal expansion coefficient different from the thermal expansion coefficient of the substrate, a first portion of the material having a thickness over the first surface of the substrate and located under the semiconductor chip, a second portion of the material having a thickness over the second surface of the substrate, a third portion of the material having a thickness over the side surface of the substrate wherein the thickness of the third portion of the material is greater than the thickness of the first portion of the material and is greater than the thickness of the second portion of the material and wherein the third portion of the material has a hole extending through the third portion of the material wherein the hole extends in a direction perpendicular to the direction of the thickness of the third portion of the material.

11. The semiconductor device of claim 10 wherein the thermal expansion coefficient of the material and the thermal expansion coefficient of the substrate produce a first thermal expansion coefficient mismatch along the first surface of the substrate and produce a second thermal expansion coefficient mismatch along the second surface of the substrate and wherein the thickness of the first portion of the material is greater than the thickness of the second portion of the material such that the first thermal expansion coefficient mismatch is substantially balanced across the substrate by the second thermal expansion coefficient mismatch to produce a net thermal expansion coefficient mismatch of approximately zero across the substrate.

12. A semiconductor component comprising:

a semiconductor chip;

a substrate with a thermal expansion coefficient, a first surface, a second surface opposite the first surface, and a side surface coupling the first and second surfaces; and a material coupled to the substrate and having a thermal expansion coefficient different from the thermal expansion coefficient of the substrate, a first portion of the material adjacent to the first surface of the substrate and having a thickness, a second portion of the material adjacent to the second surface of the substrate and having a thickness, and a third portion of the material adjacent to the side surface of the substrate and having a thickness greater than the thicknesses of the first and second portions of the material and wherein the thermal expansion coefficients of the material and the substrate produce a first thermal expansion coefficient mismatch along the first surface of the substrate and produce a second thermal expansion coefficient mismatch along the second surface of the substrate and wherein the thickness of the second portion of the material is less than or equal to the thickness of the first portion of the material such that the first thermal expansion coefficient mismatch is substantially balanced across the substrate by the second thermal expansion coefficient mismatch to minimize a net thermal expansion coefficient mismatch across the substrate and wherein the thicknesses of the first, second, and third portions of the material are measured perpendicularly from the first, second, and side surfaces, respectively.

13. The semiconductor component of claim 12 wherein the substrate is selected from the group consisting of aluminum nitride, aluminum oxide, silicon carbide, beryllium oxide, and boron nitride and wherein the material is selected from the group consisting of aluminum and copper.

14. The semiconductor component of claim 13 wherein the material encapsulates the substrate.

15. The semiconductor component claim 12 wherein the substrate has a convex bow of less than 300 microns.

16. The semiconductor component of claim 12 wherein the substrate has a substantially planar form, wherein the substrate is comprised of a ceramic, and wherein the material is comprised of a metal.

17. The semiconductor component of claim 12 wherein the first portion of the material is patterned and wherein the semiconductor chip is coupled to the first portion of the material.

18. The semiconductor component of claim 17 wherein the thickness of the first portion of the material is different from the thickness of the second portion of the material.

19. The semiconductor component of claim 18 further comprising a heatsink formed by the second portion of the material, the heatsink adjacent to the second surface of the substrate.

* * * * *